(12) United States Patent
Cho

(10) Patent No.: US 9,483,427 B2
(45) Date of Patent: Nov. 1, 2016

(54) DATA STORAGE APPARATUS

(71) Applicant: SK hynix Inc., Gyeonggi-do (KR)

(72) Inventor: Sung Yeob Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 315 days.

(21) Appl. No.: 14/159,211

(22) Filed: Jan. 20, 2014

(65) Prior Publication Data

US 2015/0143155 A1 May 21, 2015

(30) Foreign Application Priority Data

Nov. 19, 2013 (KR) .................. 10-2013-0140735

(51) Int. Cl.
| | | |
|---|---|---|
| G11C 5/06 | (2006.01) | |
| G06F 13/28 | (2006.01) | |
| G06F 3/06 | (2006.01) | |
| G06F 12/02 | (2006.01) | |
| G11C 7/10 | (2006.01) | |
| G11C 7/22 | (2006.01) | |

(52) U.S. Cl.
CPC .......... *G06F 13/287* (2013.01); *G06F 3/0679* (2013.01); *G06F 12/0246* (2013.01); *G11C 5/066* (2013.01); *G11C 7/109* (2013.01); *G11C 7/1063* (2013.01); *G11C 7/1066* (2013.01); *G11C 7/22* (2013.01); *Y02B 60/1228* (2013.01)

(58) Field of Classification Search
CPC ................................. G06F 13/287; G06F 1/12
USPC .......................................................... 713/401
See application file for complete search history.

(56) References Cited

U.S. PATENT DOCUMENTS

| | | | | |
|---|---|---|---|---|
| 3,488,634 | A * | 1/1970 | Mager ................. | G06F 13/4239 370/276 |
| 3,643,223 | A * | 2/1972 | Ruth ...................... | H03K 5/026 710/100 |
| 6,526,471 | B1 * | 2/2003 | Shimomura ........ | G06F 13/1631 711/111 |
| 7,095,788 | B1 * | 8/2006 | Cao ...................... | H03K 17/693 370/537 |
| 2007/0260857 | A1 * | 11/2007 | Bink .................... | G06F 9/3867 712/218 |
| 2009/0168525 | A1 | 7/2009 | Olbrich et al. | |

\* cited by examiner

*Primary Examiner* — Chun Cao
*Assistant Examiner* — Sumil Desai
(74) *Attorney, Agent, or Firm* — IP & T Group LLP

(57) ABSTRACT

A data storage apparatus includes a controller including a controller input/output unit suitable for receiving a ready/busy delay signal and generating a ready/busy output signal in response to a first control signal, and a memory chip including a memory input/output unit suitable for receiving a chip enable delay signal and generating a chip enable output signal in response to a second control signal. The ready/busy delay signal and the chip enable delay signal are transmitted through a substantially same transmission line.

19 Claims, 3 Drawing Sheets

DATA STORAGE APPARATUS

CROSS-REFERENCES TO RELATED APPLICATION

The present application claims priority under 35 U.S.C. 119(a) to Korean application number 10-2013-0140735, filed on Nov. 19, 2013, in the Korean Intellectual Property Office, which is incorporated herein by reference in its entirety as set forth in full.

BACKGROUND

1. Technical Field

Various embodiments relate to a data storage apparatus, and more particularly, to a data storage apparatus capable of efficiently controlling a signal transmission line.

2. Related Art

A recent paradigm of computing environments has been changed to ubiquitous computing in which a computer is available regardless of time and place. Therefore, a portable electronic apparatus such as a cellular phone, a digital camera, or a laptop computer has been extensively used. Such portable electronic apparatus generally has a data storage apparatus including a memory device.

It is advantageous that the data storage apparatus including the memory device has excellent stability and endurance because they have no mechanical driving units. The data storage apparatus has very fast information access speed and has relatively low power consumption. The data storage apparatus having such advantages includes an Universal Serial Bus (USB) memory device, a memory card with various interfaces, and a solid state drive (hereinafter, referred to as SSD).

The data storage apparatus has been developed to operate with high performance through a simple design or operation.

SUMMARY

A data storage apparatus capable of efficiently controlling a signal transmission line is described herein.

In an embodiment of the present invention, a data storage apparatus may include a controller including a controller input/output unit suitable for receiving a ready/busy delay signal and generating a ready/busy output signal in response to a first control signal, and a memory chip including a memory input/output unit suitable for receiving a chip enable delay signal and generating a chip enable output signal in response to a second control signal, wherein the ready/busy delay signal and the chip enable delay signal may be transmitted through a substantially same transmission line.

In an embodiment of the present invention, a data storage apparatus may include a first interfacing unit configured to receive a first delay signal and generate a first output signal in response to a first control signal, and a second interfacing unit configured to receive a second delay signal and generate a second output signal in response to a second control signal. The first delay signal and the second delay signal are transmitted with a same logic level intermittently at a substantially same time through a single transmission line.

A data storage apparatus according to an embodiment of the present invention is able to efficiently control a signal transmission line.

BRIEF DESCRIPTION OF THE DRAWINGS

Features, aspects, and embodiments are described in conjunction with the attached drawings, in which.

DETAILED DESCRIPTION

Figure 1:
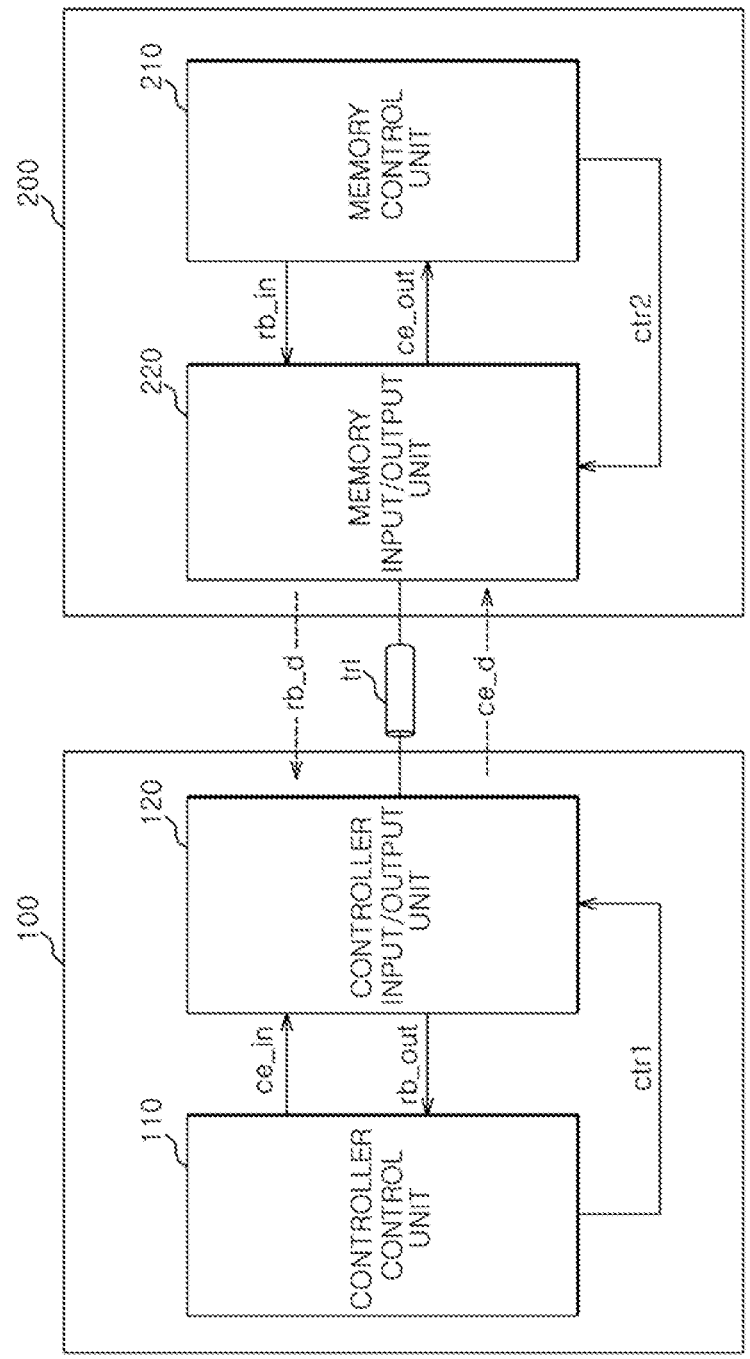
FIG. 1 is a block diagram illustrating a data storage apparatus according to an embodiment of the present invention.

Hereinafter, a data storage apparatus according to the present invention will be described below with reference to the accompanying drawings through exemplary embodiments. However, the present invention is not limited to the embodiments to be described herein, but may be embodied into other forms. The embodiments are provided to describe the present invention so that the technical scope of the present invention may be easily understood by those skilled in the art.

In the drawings, the embodiments of the present invention are not limited to illustrated specific forms, but are exaggerated for clarity. In this specification, specific terms are used to describe the present invention, but do not limit the scope of the present invention.

In this specification, terms such as and/or include any item among combinations of a plurality of related items or the plurality of related items. Furthermore, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. The terminology used herein is for the purpose of describing particular embodiments only and is not intended to be limiting of the invention. As used herein, the singular forms are intended to include the plural forms as well, unless the context clearly indicates otherwise. It will be further understood that the terms "comprise", "comprising", "have" and/or "having", when used herein, specify the presence of stated features, integers, steps, operations, elements, and/or components, but do not preclude the presence or addition of one or more other features, integers, steps, operations, elements, components, and/or groups thereof.

Hereinafter, an embodiment of the present invention will be described in detail with reference to the accompanying drawings.

FIG. 1 is a block diagram illustrating a data storage apparatus according to an embodiment of the present invention.

A data storage apparatus 10 may be one of a personal computer memory card international association card (PC-MCIA card), a compact flash card (CF card), a smart media card, a memory stick, various multimedia cards (MMC, eMMC, RS-MMC, and MMC-micro), a secure digital card (SD, Mini-SD, Micro-SD), a universal flash storage (UFS), a solid state drive and the like.

The data storage apparatus 10 may include controller 100 and a memory chip 200.

The controller 100 may control various operations of the data storage apparatus 10. The controller 100 may control read, write, and erase operations of the memory chip 200. The controller 100 may drive firmware in order to control the operation of the data storage apparatus 10.

The memory chip 200 may store data. The memory chip 200 may include a nonvolatile memory in which stored data is retained although power is off. The nonvolatile memory may be a flash memory including a NAND flash or a NOR flash, a FRAM (Ferroelectric Random Access Memory), a PRAM (Phase-change Random Access Memory), a MRAM (Magnetic Random Access Memory), or a RRAM (Resistive Random Access Memory). A transmission line trl may electrically couple the controller 100 to the memory chip 200. The transmission line trl may be one of a metal line, a through-silicon via and the like. The controller 100 and the memory chip 200 may exchange a chip enable input signal ce_in generated by the controller 100 and a ready/busy input signal rb_in generated by the memory chip 200 through the transmission line trl without signal collision.

The controller 100 may include a controller control unit 110 and a controller input/output unit 120.

The controller control unit 110 may generate a first control signal ctrl1 in order to control the controller input/output unit 120. The controller control unit 110 may output the chip enable input signal ce_in to the controller input/output unit 120 and may receive a ready/busy output signal rb_out from the controller input/output unit 120.

The controller input/output unit 120 may receive the chip enable input signal ce_ n and may output a chip enable delay signal ce_d to the transmission line trl in response to the first control signal ctr1. The controller input/output unit 120 may transfer a ready/busy delay signal rb_d, which is transmitted from a memory input/output unit 220 through the transmission line trl in response to a second control signal ctrl2, to the controller control unit 110 as the ready/busy output signal rb_out in response to the first control signal ctrl1.

The memory chip 200 may include a memory control unit 210 and a memory input/output unit 220.

The memory control unit 210 may generate the second control signal ctrl2 in order to control the memory input/output unit 220. The memory control unit 210 may output the ready/busy input signal rb_in to the memory input/output unit 220 and may receive a chip enable output signal ce_out from the memory input/output unit 220.

The memory input/output unit 220 may receive the ready/busy input signal rb_in and may output the ready/busy delay signal rb_d to the transmission line trl in response to the second control signal ctrl2. The memory input/output unit 220 may transfer the chip enable delay signal ce_d, which is transmitted from the controller input/output unit 120 through the transmission line trl in response to the first control signal ctrl1, to the memory control unit 210 as the chip enable output signal ce_out in response to the second control signal ctrl2.

The controller 100 may enable the memory chip 200 with the chip enable input signal ce_in. For example, the controller control unit 110 may output the enabled chip enable input signal ce_in in order to control the memory chip 200.

The memory chip 200 informs the controller 100 of an operation state of the memory chip 200 with the ready/busy input signal rb_in. For example, the memory control unit 210 may output the enabled ready/busy input signal rb_in in order to inform that the memory chip 200 is performing an internal operation. The memory control unit 210 may output the disabled ready/busy input signal rb_in in order to inform that the memory chip 200 is not performing the internal operation.

FIG. 1 illustrates the data storage apparatus 10 including one memory chip 200. However, the data storage apparatus 10 may include a plurality of memory chips. Each of the plurality of memory chips may be the same as the memory chip 200 shown in FIG. 1. In such case, the controller 100 may include a plurality of the controller input/output units 120 respectively corresponding to the plurality of the memory chips 200. Each of the plurality of the controller input/output units 120 may be the same as the controller input/output unit 120 of FIG. 1.

Figure 2:
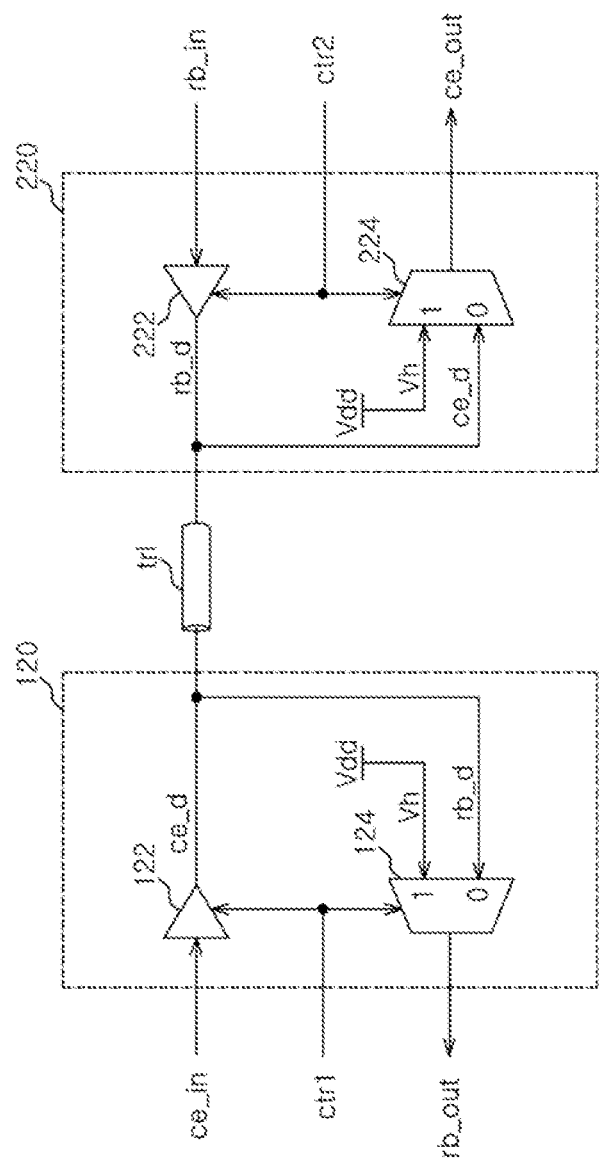
FIG. 2 is a circuit diagram illustrating a controller input/output unit and a memory input/output unit shown in FIG. 1.

FIG. 2 is a circuit diagram illustrating the controller input/output unit 120 and the memory input/output unit 220 shown in FIG. 1.

The controller input/output unit 120 may include first buffer 122 and a first multiplexer 124.

The first buffer 122 may receive the chip enable input signal ce_in. The first buffer 122 may output the chip enable delay signal ce_d to the transmission line trl in response to an enabled first control signal ctrl1.

The first multiplexer 124 may output one of the ready/busy delay signal rb_d transmitted through the transmission line trl and a setting signal Vh as the ready/busy output signal rb_out in response to the first control signal ctrl1. For example, the first multiplexer 124 may output the ready/busy delay signal rb_d as the ready/busy output signal rb_out in response to a disabled first control signal ctrl1, For example, the first multiplexer 124 may output the setting signal Vh as the ready/busy output signal rb_out in response to the enabled first control signal ctrl1. At this time, the setting signal Vh may be a logic high signal, and for example, may have a voltage level substantially same as that of a power supply voltage Vdd.

The memory input/output unit 220 may include a second buffer 222 and a second multiplexer 224.

The second buffer 222 may receive the ready/busy input signal rb_in. The second buffer 222 may output the ready/busy delay signal rb_d to the transmission line trl in response to an enabled second control signal ctrl2.

The second multiplexer 224 may output one of the chip enable delay signal ce_d transmitted through the transmission line trl and the setting signal Vh as the chip enable output signal ce_out in response to the second control signal ctrl2. For example, the second multiplexer 224 may output the chip enable delay signal ce_d as the chip enable output signal ce_out in response to a disabled second control signal ctrl2. For example, the second multiplexer 224 may output the setting signal Vh as the chip enable output signal ce_out in response to the enabled second control signal ctrl2.

Figure 3:
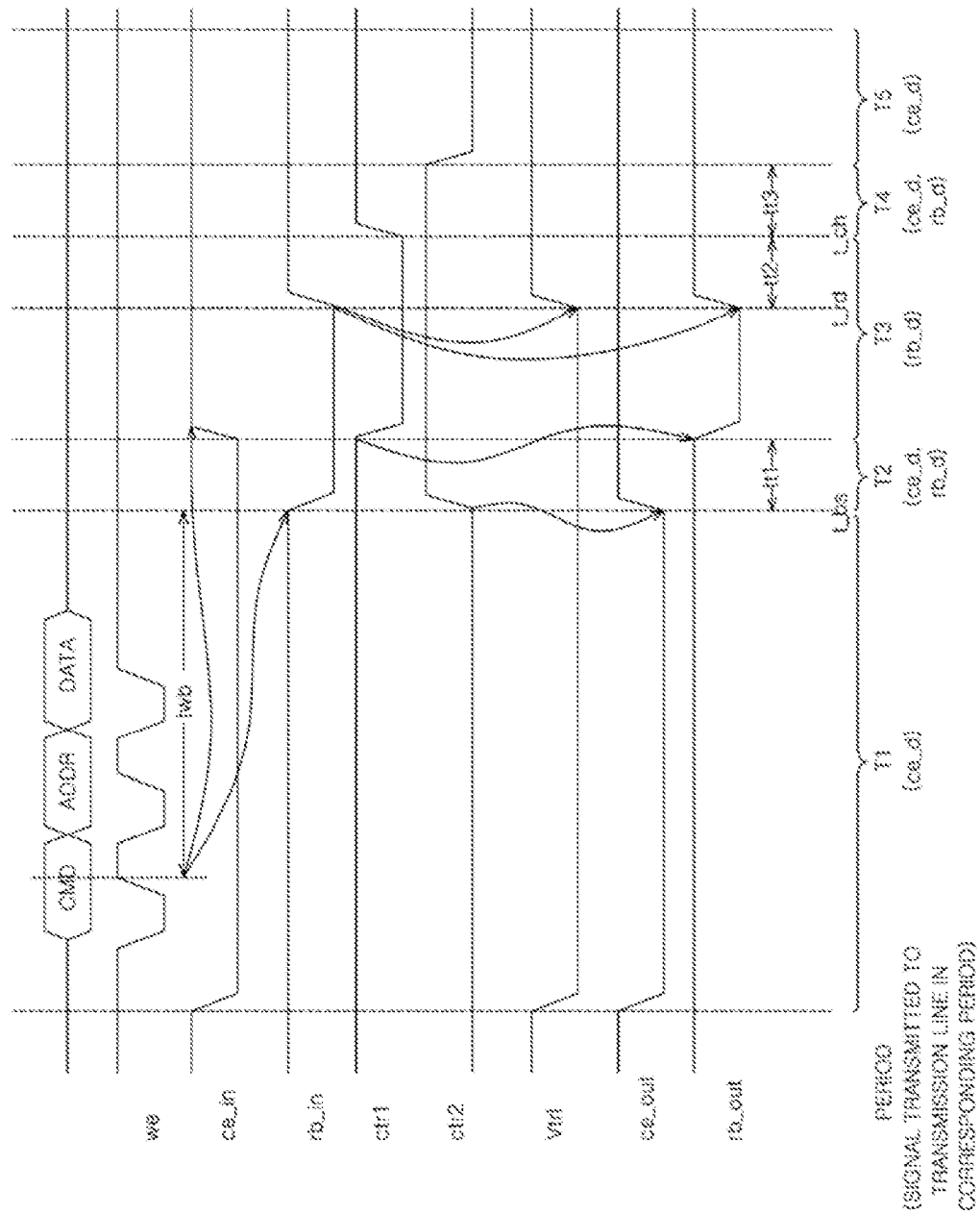
FIG. 3 is a timing diagram illustrating operation of a controller and a memory chip shown in FIG. 1.

FIG. 3 is a timing diagram illustrating operation of the controller 100 and the memory chip 200 shown in FIG. 1.

FIG. 3 illustrates a read command CMD, an address ADD, data DATA, a write enable signal we, the chip enable input signal ce_in, the ready/busy input signal rb_in, the first control signal ctrl1, the second control signal ctrl2, a voltage level Vtrl of the transmission line trl, the chip enable output signal ce_out, and the ready/busy output signal rb_out. The voltage level Vtrl of the transmission line trl may indicate voltage levels by the chip enable delay signal ce_d and the ready/busy delay signal rb_d that are transmitted through the transmission line trl.

Hereinafter, with reference to FIGS. 1 to 3, a description will be provided for operation of signal transmission during write operation of the data storage apparatus 10, which may be similar to that during read operation and erase operation of the data storage apparatus 10.

In the following description, it should be understood as an example that the chip enable input signal ce_m, the chip enable delay signal ce_d, the chip enable output signal ce_out, the ready/busy input signal rb_in, the ready/busy delay signal rb_d and the chip enable output signal ce_out are enabled when a logic level is low. Also, it should be understood as an example that the first control signal ctrl1 and the second control signal ctrl2 are enabled when a logic level is high. Relationship between the enablement and the logic level may vary according to a circuit design, which is obvious to those in the related art, and thus it should be understood that the described relationship between the enablement and the logic level does not limit the scope of the present invention.

The data storage apparatus 10 may be in a setup state when starting to operate. The controller 100 in the setup state may output the chip enable delay signal ce_d to the transmission line trl. The memory chip 200 in the setup state may not output the ready/busy delay signal rb_d to the transmission line trl. In the setup state, the first control signal ctrl1 may be enabled and the second control signal ctrl2 may be disabled. In a period T1, in which the data storage apparatus 10 may perform an operation, the data storage apparatus 10 may be in the setup state.

During the write operation of the data storage apparatus 10, an entire operation period may be divided into periods T1 to T5 according to the signals that are transmitted through the transmission line trl. For example, the chip enable delay signal ce_d may be transmitted through the transmission line td in the period T1 while the chip enable delay signal ce_d and the ready/busy delay signal rb_d may be transmitted through the transmission line trl in the period T2.

In the period T1, the chip enable delay signal ce_d may be transmitted through the transmission line trl.

The controller control unit 110 may output the enabled chip enable input signal ce_in in order to enable the memory chip 200. The controller input/output unit 120 may receive the enabled chip enable input signal ce_in and output the enabled chip enable delay signal ce_d to the transmission line trl. The memory control unit 210 may output the disabled ready/busy input signal rb_in for notification that it is not performing an internal operation. At this time, the memory input/output unit 220 may not output a disabled ready/busy delay signal rb_d to the transmission line trl. To summarize, in order to substantially prevent collision of the enabled chip enable delay signal ce_d and the disabled ready/busy delay signal rb_d, which have different logic levels from each other on the transmission line trl, only one of the signals of different logic levels to be transmitted through the transmission line trl, for example, the enabled chip enable delay signal ce_d output from the controller input/output unit 120, may be on the transmission line trl.

A detailed operation will be described as follows. For the period T1, the first buffer 122 may receive the enabled chip enable input signal ce_in. The first buffer 122 may output the enabled chip enable delay signal ce_d to the transmission line trl in response to an enabled first control signal ctrl1. The second multiplexer 224 may output the enabled chip enable delay signal ce_d as the enabled chip enable output signal ce_out in response to the disabled second control signal ctrl2. Since the second buffer 222 does not operate in response to the disabled second control signal ctrl2, the ready/busy delay signal rb_d may not be outputted to the transmission line trl. At this time, the first multiplexer 124 may output the setting signal Vh as the disabled ready/busy output signal rb_out in response to the enabled first control signal ctrl1.

The memory chip 200 may be enabled by the enabled chip enable output signal ce_out and receive the write command CMD, the address ADD, and the data DATA through a channel (not illustrated). The memory clip 200 may latch the write command CMD, the address ADD, and the data DATA at the rising edge of the write enable signal we that is transmitted through the channel and store the write command CMD, the address ADD, and the data DATA in a register (not illustrated).

The memory control unit 210 may output the enabled ready/busy input signal rb_in a time period twb after receiving the write command CMD. The time period twb may be preset. The controller 100 may operate according to the time period twb plus a preset margin tt1 for transition from the disabled state to the enabled state of the ready/busy input signal rb_in.

In the period T2, the chip enable delay signal ce_d and the ready/busy delay signal rb_d may be transmitted through the transmission line trl.

The memory control unit 210 may output the enabled ready/busy input signal rb_in as the memory control unit 210 is performing the internal operation based on the write command CMD. The memory input/output unit 220 may receive the enabled ready/busy input signal rb_in and output the enabled ready/busy delay signal rb_d to the transmission line trl. The controller control unit 110 may output the enabled chip enable input signal ce_in. Further to the period T1, the controller input/output unit 120 may receive the enabled chip enable input signal ce_in and may output the enabled chip enable delay signal ce_d to the transmission line trl until the time period twb plus a preset margin tt1 elapses after the reception of the write command CMD at the memory control unit 210. FIG. 3 illustrates the ending time point t_bs of the time period twb after the reception of the write command CMD and the preset margin tt1 after the time period twb for transition from the disabled state to the enabled state of the ready/busy input signal rb_in. Therefore, although the chip enable delay signal ce_d and the ready/busy delay signal rb_d are simultaneously transmitted through the transmission line trl for the preset margin tt1, they may not collide with each other because both of the chip enable delay signal ce_d and the ready/busy delay signal rb_d are enabled during the preset margin tt1, and thus voltage levels of the enabled chip enable delay signal ce_d and the enabled ready/busy delay signal rb_d are substantially same logic low levels during the preset margin tt1.

A detailed operation will be described as follows. For the period T2, the first buffer 122 may receive the enabled chip enable input signal ce_in. The first buffer 122 may output the enabled chip enable delay signal ce_d to the transmission line trl in response to the enabled first control signal ctrl1. At this time, the second multiplexer 224 may output the setting signal Vh as the disabled ready/busy output signal rb_out in response to the enabled second control signal ctrl2. The second buffer 222 may receive the enabled ready/busy input signal rb_in. The second buffer 222 may output the enabled ready/busy delay signal rb_d to the transmission line trl in response to the enabled second control signal ctrl2. At this time, the first multiplexer 124 may output the setting signal Vh as the disabled ready/busy output signal rb_out in response to the enabled first control signal ctrl1.

In the period T3, the ready/busy delay signal rb_d may be transmitted through the transmission line trl.

The memory control unit 210 may output the ready/busy input signal rb_in. When the memory control unit 210 completes the internal operation, the memory control unit 210 may change the state of the ready/busy input signal rb_in from the enabled state to the disabled state at a time point t_rd in the period T3. The memory input/output unit 220 may receive the disabled ready/busy input signal rb_in and may output the disabled ready/busy delay signal rb_d to the transmission line trl after the time point t_rd. The controller control unit 110 may output a disabled chip enable input signal ce_in for notification that it does not transmit a command, an address, and data to the memory chip 200. At this time, the controller input/output unit 120 may not output a disabled chip enable delay signal ce_d to the transmission line trl. To summarize, in order to substantially prevent collision of the disabled chip enable delay signal ce_d and the ready/busy delay signal rb_d, which is transitioned from the enabled state to the disabled state at the time point t_rd in the period T3 thereby both signals having different logic levels to each other before the time point t_rd in the period T3, on the transmission line trl, only one of the signals of different logic levels to be transmitted through the transmission line trl, for example, the enabled ready/busy delay signal rb_d output from the memory input/output unit 220, may be on the transmission line trl.

A detailed operation will be described as follows. For the period T3, the second buffer 222 may receive the ready/busy delay signal rb_d that is transitioned from the enabled state to the disabled state at the time point t_rd in the period T3. The second buffer 222 may output the ready/busy delay signal rb_d, which is transitioned from the enabled state to the disabled state at the time point t_rd in the period T3, to the transmission line trl in response to the enabled second control signal ctrl2. The first multiplexer 124 may output the ready/busy delay signal rb_d, which is transitioned from the enabled state to the disabled state at the time point t_rd in the period T3, as the ready/busy output signal rb_out in response to a disabled first control signal ctrl1. The first buffer 122 may not output the chip enable input signal ce_in to the transmission line trl in response to the disabled first control signal ctrl1. At this time, the second multiplexer 224 may output the setting signal Vh as the disabled chip enable output signal ce_out in response to the enabled second control signal ctrl2.

The controller 100 may recognize that the internal operation of the memory chip 200 has been completed according to the ready/busy output signal rb_out at a time point t_ch that is a predetermined margin tt2 after the time point t_rd in the period T3 when the states of the ready/busy input signal rb_in and the ready/busy delay signal rb_d are transitioned from the enabled state to the disabled state. The controller 100 may check the transition of the ready/busy output signal rb_out during the predetermined time tt2.

In the period T4, the chip enable delay signal ce_d and the ready/busy delay signal rb_d may be transmitted through the transmission line trl.

The memory control unit 210 may output the disabled ready/busy input signal rb_in, because it is not performing an internal operation. Further to the period T3, the memory input/output unit 220 may receive the disabled ready/busy input signal rb_in and may output the disabled ready/busy delay signal rb_d to the transmission line trl until a predetermined time tt3 elapses after the time point t_ch or the end of the predetermined time tt2 in order to inform that the internal operation has been completed. The controller control unit 110 may output the disabled chip enable input signal ce_in. The controller input/output unit 120 may receive the disabled chip enable input signal ce_in and may output the disabled chip enable delay signal ce_d to the transmission line trl from the time point t_ch or the end of the predetermined time tt2, during which the transition of the ready/busy output signal rb_out is checked by the controller 100, in order to return to the setup state. Therefore, although the chip enable delay signal ce_d and the ready/busy delay signal rb_d are simultaneously transmitted through the transmission line trl for the predetermined time tt3, they may not collide with each other, because both of the chip enable delay signal ce_d and the ready/busy delay signal rb_d are disabled during the predetermined time tt3, and thus voltage levels of the disabled chip enable delay signal ce_d and the disabled ready/busy delay signal rb_d are substantially same logic high levels during the predetermined time tt3.

A detailed operation be described as follows. For the period T4, the first buffer 122 may receive the disabled chip enable input signal ce_in. The first buffer 122 may output the disabled chip enable delay signal ce_d to the transmission line trl in response to the enabled first control signal ctrl1. At this time, the second multiplexer 224 may output the setting signal Vh as the disabled ready/busy output signal rb_out in response to the enabled second control signal ctrl2. The second buffer 222 may receive the disabled ready/busy input signal rb_in. The second buffer 222 may output the disabled ready/busy delay signal rb_d to the transmission line trl in response to the enabled second control signal ctrl2. At this time, the first multiplexer 124 may output the setting signal Vh as the disabled ready/busy output signal rb_out in response to the enabled first control signal ctrl1.

In the period T5, the chip enable delay signal ce_d may be transmitted through the transmission line trl.

The controller control unit 110 may output the disabled chip enable input signal ce_in. The controller input/output unit 120 may receive the disabled chip enable input signal ce_in and may output the disabled chip enable delay signal ce_d to the transmission line trl in order to return to the setup state. The memory control unit 210 may output the disabled ready/busy input signal rb_in, because it is not performing an internal operation. At this time, the memory input/output unit 220 may not output the disabled ready/busy delay signal rb_d to the transmission line trl.

A detailed operation be described as follows. For the period T5, the first buffer 122 may receive the disabled chip enable input signal ce_in. The first buffer 122 may output the disabled chip enable delay signal ce_d to the transmission line trl in response to the enabled first control signal ctrl1. The second multiplexer 224 may output the disabled chip enable delay signal ce_d as the disabled chip enable output signal ce_out in response to the disabled second control signal ctrl2. Since the second buffer 222 does not operate in response to the disabled second control signal ctrl2, the ready/busy delay signal rb_d may not be outputted to the transmission line trl. At this time, the first multiplexer 124 may out the setting signal Vh as the disabled ready/busy output signal rb_out in response to the enabled first control signal ctrl1.

While certain embodiments have been described above, it will be understood to those skilled in the art that the embodiments described are by way of example only. Accordingly, the data storage apparatus described herein should not be limited based on the described embodiments. Rather, the data storage apparatus described herein should only be limited in light of the claims that follow.

What is claimed is:

1. A data storage apparatus comprising:
   a controller including a controller input/output unit suitable for receiving a ready/busy delay signal and generating a ready/busy output signal in response to a first control signal; and
   a memory chip including a memory input/output unit suitable for receiving a chip enable delay signal and generating a chip enable output signal in response to a second control signal,
   wherein the ready/busy delay signal and the chip enable delay signal are transmitted through a single transmission line, the controller input/output unit generates and outputs the chip enable delay signal to the transmission line based on a chip enable input signal in response to the first control signal that is in an enabled state, the memory input/output unit generates and outputs the ready/busy delay signal to the transmission line based on a ready/busy input signal in response to the second control signal that is in an enabled state, both of the first control signal and the second control signal are in the enabled state for a predetermined time, and both of the ready/busy delay signal and the chip enable delay signal are transmitted through the single transmission line with a substantially same voltage level for the predetermined time.

2. The data storage apparatus according to claim 1, wherein the controller input/output unit comprises a first multiplexer suitable for outputting one of the ready/busy delay signal and a setting signal as the ready/busy output signal in response to the first control signal.

3. The data storage apparatus according to claim 2, wherein the first multiplexer outputs the ready/busy delay signal as the ready/busy output signal in response to the first control signal that is in a disabled state and outputs the setting signal as the ready/busy output signal in response to the first control signal that is in the enabled state.

4. The data storage apparatus according to claim 1, wherein the memory input/output unit comprises a second multiplexer suitable for outputting one of the chip enable delay signal and a setting signal as the chip enable output signal in response to the second control signal.

5. The data storage apparatus according to claim 4, wherein the second multiplexer outputs the chip enable delay signal as the chip enable output signal in response to the second control signal that is in a disabled state, and outputs the setting signal as the chip enable output signal in response to the second control signal that is in the enabled state.

6. The data storage apparatus according to claim 1, wherein, when the controller input/output unit outputs an enabled chip enable delay signal to the transmission line in response to the first control signal that is in the enabled state, the second control signal is in a disabled state for a first time.

7. The data storage apparatus according to claim 6, wherein the first time ends at a time point at which the ready/busy input signal is transitioned from a disabled state to an enabled state.

8. The data storage apparatus according to claim 1, wherein, for a second time from a time point at which the ready/busy input signal is transitioned from a disabled state to an enabled state, the controller input/output unit outputs the chip enable delay signal to the transmission line, and the memory input/output unit outputs the ready/busy delay signal to the transmission line.

9. The data storage apparatus according to claim 8, wherein, for the second time, the chip enable delay signal and the ready/busy delay signal are transmitted with a substantially same voltage level.

10. The data storage apparatus according to claim 1, wherein, when the memory input/output unit outputs the ready/busy delay signal, which is transitioned from an enabled state to a disabled state, to the transmission line in response to the second control signal that is in the enabled state, the first control signal is in a disabled state for a third time.

11. The data storage apparatus according to claim 10, wherein, for the third time, the ready/busy input signal is transitioned from an enabled state to a disabled state.

12. The data storage apparatus according to claim 10, wherein, through transition of the ready/busy output signal, the controller checks that an internal operation of the memory chip has been completed.

13. The data storage apparatus according to claim 1, wherein, for a predetermined time from a time point at which the ready/busy input signal is transitioned from an enabled state to a disabled state, the memory input/output unit outputs the ready/busy delay signal to the transmission line.

14. The data storage apparatus according to claim 13, wherein the controller input/output unit outputs the chip enable delay signal to the transmission line from a time point at which the controller checks transition of the ready/busy output signal.

15. The data storage apparatus according to claim 14, wherein the chip enable delay signal and the ready/busy delay signal are transmitted with a substantially same voltage level from a time point at which the controller checks transition of the ready/busy output signal to a time point at which the predetermined time ends.

16. The data storage apparatus according to claim 1, wherein the ready/busy input signal is used when the memory chip informs the controller of an operation state of the memory chip.

17. A data storage apparatus comprising:
a first interfacing unit suitable for receiving a first delay signal and generating a first output signal in response to a first control signal; and a second interfacing unit suitable for receiving a second delay signal and generating a second output signal in response to a second control signal, wherein the first delay signal and the second delay signal are transmitted with a same logic level intermittently at a substantially same time through a single transmission line, the first interfacing unit receives a second input signal, and generates and outputs the second delay signal to the transmission line based on the second input signal in response to the first control signal that is enabled, the second interfacing unit receives a first input signal and generates and outputs the first delay signal to the transmission line based on the first input signal in response to the second control signal that is enabled, both of the first control signal and the second control signal are in the enabled state for a predetermined time, and both of the first delay signal and the second delay signal are transmitted through the single transmission line with a substantially same voltage level for the predetermined time.

18. The data storage apparatus according to claim 17, further comprising:
a first controller suitable for generating the second input signal and the first control signal and receiving the first output signal; and a second controller suitable for generating the first input signal and the second control signal and receiving the second output signal.

19. The data storage apparatus according to claim 1, wherein the controller further includes a controller control unit suitable for generating the chip enable input signal and the first control signal and outputting the chip enable input signal and the first control signal to the controller input/output unit, and the memory chip further includes a memory control unit suitable for generating the ready/busy input signal and the second control signal and outputting the ready/busy input signal and the second control signal to the memory input/output unit.

\* \* \* \* \*